(12) United States Patent　　(10) Patent No.: US 9,214,921 B2
Yamada et al.　　(45) Date of Patent: Dec. 15, 2015

(54) SAMPLING RATE CONVERSION DEVICE

(71) Applicant: NTT ELECTRONICS CORPORATION, Yokohama-shi, Kanagawa (JP)

(72) Inventors: Yasuhiro Yamada, Yokohama (JP); Yuichiro Koike, Yokohama (JP)

(73) Assignee: NTT ELECTRONICS CORPORATION, Yokohama (JP)

( * ) Notice: Subject to any disclaimer, the term of this patent is extended or adjusted under 35 U.S.C. 154(b) by 0 days.

(21) Appl. No.: 14/420,651

(22) PCT Filed: Apr. 8, 2013

(86) PCT No.: PCT/JP2013/060606
§ 371 (c)(1),
(2) Date: Feb. 9, 2015

(87) PCT Pub. No.: WO2014/030384
PCT Pub. Date: Feb. 27, 2014

(65) Prior Publication Data
US 2015/0222248 A1　Aug. 6, 2015

(30) Foreign Application Priority Data
Aug. 23, 2012　(JP) .................. 2012-184291

(51) Int. Cl.
*H03H 17/06* (2006.01)
*H03H 17/02* (2006.01)
*H03H 17/00* (2006.01)

(52) U.S. Cl.
CPC ........... *H03H 17/0248* (2013.01); *H03H 17/00* (2013.01); *H03H 17/0642* (2013.01)

(58) Field of Classification Search
CPC ................... H03H 17/06–17/0685; H03H 17/0427–17/0455; H02H 17/0455
USPC ............................................ 341/61
See application file for complete search history.

(56) References Cited

U.S. PATENT DOCUMENTS 4,748,578 A * 5/1988 Lagadec et al. ............... 708/313
8,000,423 B2 * 8/2011 Auld et al. ..................... 375/350

FOREIGN PATENT DOCUMENTS

| JP | 04-072905 A | 3/1992 |
| JP | 08-065105 A | 3/1996 |
| JP | 08-084048 A | 3/1996 |
| WO | WO 2006077795 A1 * | 7/2006 |

OTHER PUBLICATIONS

International Preliminary Report issued Mar. 5, 2015; Application No. PCT/JP2013/060606.

(Continued)

*Primary Examiner* — Howard Williams
(74) *Attorney, Agent, or Firm* — Arent Fox LLP

(57) ABSTRACT

A position coordinate difference calculation section 5 calculates a position coordinate difference between a position coordinate of an output digital signal and a position coordinate of an input digital signal close to it. AN FIR coefficient memory 9 stores FIR coefficients of an FIR-LPF having such a characteristic as to cut off frequency components equal to or higher than ½ of an output sampling rate. When the position coordinate difference is input, the FIR coefficient memory outputs FIR coefficients corresponding to position coordinate differences between position coordinates of a certain number of input digital signals existing in the vicinity of the position coordinate of the output digital signal and the position coordinate of the output digital signal. AN FIR computation unit 3 performs FIR-LPF interpolation computation by using a certain number of the input digital signals and the FIR coefficients and obtains the output digital signal.

4 Claims, 10 Drawing Sheets

OTHER PUBLICATIONS

International Search Report and Written Opinion of PCT/JP2013/060606 dated Jul. 9, 2013.

Japanese Office Action with partial translation in Application No. 2012-184291 dated Oct. 15, 2013.

* cited by examiner

US 9,214,921 B2

SAMPLING RATE CONVERSION DEVICE

CROSS-REFERENCE TO RELATED APPLICATION

This application is a National Stage entry of International Application No. PCT/JP2013/060606, filed Apr. 8, 2013, which claims priority to Japanese Patent Application No. 2012-184291, filed Aug. 23, 2012. The disclosures of the priority applications are incorporated in their entirety herein by reference.

TECHNICAL FIELD

The present invention relates to a sampling rate conversion device for use in digital image size converters, digital audio, etc.

BACKGROUND ART

A sampling rate conversion device for converting an input digital signal sampled at an input sampling rate into an output digital signal sampled at an output sampling rate is used. A conventional sampling rate conversion device first sets the ratio of an input sampling rate R1 and an output sampling rate R2 as R1:R2=A·M:A·N=M:N (where A is a constant, and M and N are positive integers prime to each other) and converts the input sampling rate R1 to a sampling rate R3=R1·N=R2·M (upsampling), which is the least common multiple between the input sampling rate R1 and the output sampling rate R2. Next, samples corresponding to the output sampling rate R2 are extracted from the sequence of the number of sampled values N times larger than that of the values of the input digital signal (downsampling), thereby obtaining an output digital signal.

FIG. 9 is a diagram for explaining a conventional sampling rate conversion method. Circles in FIG. 9 indicate a digital signal at a sampling rate R3. Hatched ones in the circles indicate an input digital signal at an input sampling rate R1; thick-line ones, an output digital signal at an output sampling rate R2; and thin-line blank ones, components other than those of the input and output digital signals.

The digital signal at the sampling rate R3 is calculated (upsampled) from the input digital signal. In this calculation, calculation of interpolation values using a finite impulse response-low pass filter (FIR-LPF) having such a characteristic as to cut off frequency components equal to or higher than ½ of the output sampling rate R2 is performed. An output digital signal at the output sampling rate R2 is then extracted (downsampled) from the digital signal at the sampling rate R3.

A case where the sampling rate is reduced is called downsampling. In the case of downsampling, an FIR-LPF is used to suppress aliasing noise due to the reduction in sampling rate by cutting off high-frequency components of the input. On the other hand, a case where the sampling rate is increased is called upsampling. In the case of upsampling, there is no need to cut off high-frequency components of the input but an FIR-LPF is used to calculate interpolation values at positions different from those of the input digital signal.

FIG. 10 is a diagram showing impulse response of an FIR-LPF. Impulse response of the filter is expressed by a time function obtained by inverse Fourier transforming a predetermined filter characteristic. With respect to input of an impulse input at a time 0, impulse response waveforms exist before and after the time 0. In calculation of interpolation values, an output digital signal at the time 0 is calculated by using the input digital signal in the range of existence of the impulse response waveforms. An impulse response waveform ordinarily lasts long. To make the calculation practical, however, signal processing is performed by terminating the impulse response waveform by a certain finite length.

In an actual device, a time at which an impulse response begins (negative time) is set as 0 or a positive number. More specifically, sampling rate conversion is made by converting the impulse response starting time—T to 0 while setting the original time 0 as T. In digital signal processing, such time shifting processing can be performed if a memory (shift register) is used.

CITATION LIST

Patent Literature

Patent Literature 1: Japanese Patent Laid-Open No. 8-84048

SUMMARY OF INVENTION

Technical Problem

Conventionally, samples at a high sampling rate R3 in which two groups of samples: samples at a sampling rate R1 and samples at a sampling rate R2 exist are formed and a sequence of samples at the sampling rate R2 is extracted from the samples at the sampling rate R3. For example, if R1=15 MHz and R2=16 MHz, the sampling rate R3 at which the two groups of samples exist is R3=15×16 MHz=240 MHz. It has been difficult to realize by a low-cost semiconductor technique a device using such a markedly high sampling rate R3. Further, a design of a digital circuit in which three operating clock frequencies corresponding to the three sampling rates R1, R2, and R3 is complicated and difficult to achieve. Also, there is a demand for a general-purpose sampling rate conversion device compatible with arbitrary input and output sampling rates (i.e., arbitrary M and N).

Incorporation of a parallel arrangement of a plurality of FIR computation sections capable of operating at two sampling rates R1 and R2 for the purpose of avoiding use of the high sampling rate R3 has been proposed (see, for example, Patent Literature 1). With incorporation of a parallel arrangement of a plurality of FIR computation sections, however, there is a problem that the scale of the circuit is considerably increased.

The present invention has been achieved to solve the above-described problem, and an object of the present invention is to provide a sampling rate conversion device which is small in circuit scale, low-priced and adaptable to a wide variety of applications.

Means for Solving the Problems

A sampling rate conversion device according to the present invention which converts an input digital signal sampled at an input sampling rate into an output digital signal sampled at an output sampling rate, includes: a position coordinate difference calculation section calculating a position coordinate difference Dk between a position coordinate of an input digital signal close to a position coordinate Tk of an output digital signal Yk and the position coordinate Tk; an FIR coefficient memory storing, with respect to a finite impulse response-low pass filter (FIR-LPF) having such a characteristic as to cut off frequency components equal to or higher than ½ of the output sampling rate, an FIR coefficient F(z) of the FIR-LPF when a position coordinate of an impulse input to the FIR-LPF is z=0, wherein when the position coordinate difference Dk is input, the FIR coefficient memory outputs FIR coefficients F (Zk(q)−Tk) corresponding to a position coordinate differences (Zk(q)−Tk) with respect to Zk(q) (q=1, 2, ..., p) representing position coordinates of a certain number (p) of input digital signals Xk(q) existing in the vicinity of the position coordinate Tk of the output digital signal Yk; and an FIR computation unit computing Yk=F(Zk(1)−Tk)*Xk(1)+F(Zk(2)−Tk)*Xk(2)+ ... +F(Zk(p)−Tk)*Xk(p) and obtaining the output digital signal Yk.

Advantageous Effects of Invention

The present invention makes it possible to provide a sampling rate conversion device which is small in circuit scale, low-priced and adaptable to a wide variety of applications.

DESCRIPTION OF EMBODIMENTS

A sampling rate conversion device according to the embodiments of the present invention will be described with reference to the drawings. The same components will be denoted by the same symbols, and the repeated description thereof may be omitted.

Embodiment 1

Figure 1:
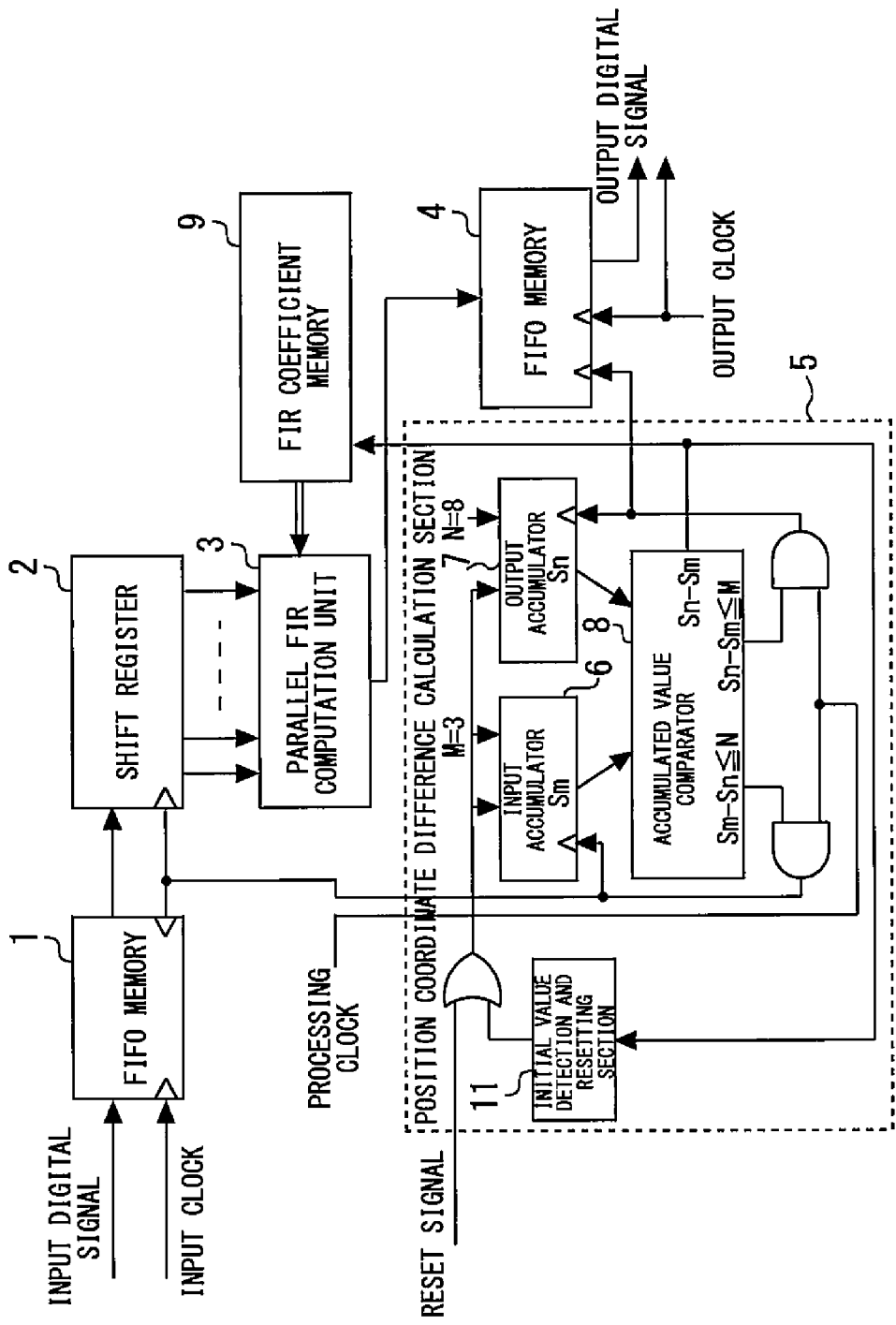
FIG. 1 is a block diagram showing a sampling rate conversion device according to Embodiment 1 of the present invention.

FIG. 1 is a block diagram showing a sampling rate conversion device according to Embodiment 1 of the present invention. This device converts an input digital signal sampled at an input sampling rate into an output digital signal sampled at an output sampling rate. In the present embodiment, the device is intended for image sampling rate conversion and geometrically converts a number of samples in a predetermined region on a frame. Accordingly, sampling rate conversion in this case means two sampling rate conversions with respect to two coordinate axes: the horizontal and vertical axes in a two dimensional space coordinate system.

The device in the present embodiment operates on a processing clock at a frequency higher than the input and output sampling rates. In the case of processing on an HD60P image (1920×1080×60/sec), the actual clock frequency is about 148.5 MHz. AN FIFO memory 1 temporarily stores an input digital signal and thereafter supplies the signal to a shift register 2 in synchronization with the processing clock. A parallel FIR computation unit 3 converts the input digital signal supplied from the shift register 2 into an output digital signal. AN FIFO memory 4 temporarily stores the output digital signal and thereafter outputs the output digital signal in synchronization with an output clock.

A position coordinate difference calculation section 5 calculates a position coordinate difference Dk between a position coordinate of the input digital signal close to the position coordinate Tk of a kth output digital signal Yk and the position coordinate Tk in synchronization with the processing clock. The "input digital signal close to the position coordinate Tk" is one of (1) the closest input digital signal having a position coordinate difference which is zero or positive from the position coordinate Tk, (2) the closest input digital signal having a position coordinate difference which is zero or negative from the position coordinate Tk, or (3) the closest input digital signal as a result of absolute value evaluation of the position coordinate difference from the position coordinate Tk. The object input digital signal may be shifted by one input sampling period depending on which criterion is adopted. More specifically, the position coordinate difference calculation section 5 has an input accumulator 6, an output accumulator 7 and an accumulated value comparator 8 for controlling the accumulators. The input digital signal sampling period and the output digital signal sampling period are assumed to be C·M and C·N, respectively, where C is a constant and M and N are positive integers prime to each other. The input accumulator 6 accumulates M and outputs an accumulated value Sm. The output accumulator 7 accumulates N and outputs an accumulated value Sn. The accumulated value comparator 8 makes the input accumulator 6 accumulate M when Sm−Sn≤N, makes the output accumulator 7 accumulate N when Sn−Sm≤M, and outputs, as position coordinate difference Dk, Sn−Sm obtained when the output accumulator 7 is made to accumulate N.

In the present embodiment, it is assumed that input period M=3 and output period N=8. These values M and N are used in processing for sampling rate conversion in the horizontal direction when an HD image (1920×1088) is converted into an SD image (720×480). M=4 and N=9 in the case of sampling rate conversion in the vertical direction.

AN FIR coefficient memory 9 is a random access memory (RAM) or a read only memory (ROM) storing, with respect to a finite impulse response-low pass filter (FIR-LPF) having such a characteristic as to cut off frequency components equal to or higher than ½ of the output sampling rate, an FIR coefficient F(z) of the FIR-LPF when the position coordinate of an impulse input to the FIR-LPF is z=0. When the position coordinate difference Dk=Sn−Sm is input from the position coordinate difference calculation section 5, the FIR coefficient memory 9 outputs the FIR coefficients F(Zk(q)−Tk) corresponding to the position coordinate differences (Zk(q)−Tk) with respect to Zk(q) (q=1, 2, ..., p) representing the position coordinates of a certain number (p) of input digital signals Xk(q) existing in the vicinity of the position coordinate Tk of the output digital signal Yk.

Accordingly, the FIR coefficient memory 9 stores a set of FIR coefficients with respect to each sort of position coordinate difference Dk and selects to output the set of FIR coefficients according to the input position coordinate difference Dk. Since M number of output periods N exist in the period corresponding to the least common multiple M·N between the input period M and the output period N, M number of sorts of position coordinate difference Dk exist and M number of sets of FIR coefficients are required.

When supplied with the input digital signal from the shift register 2 and with the FIR coefficients from the FIR coefficient memory 9, the parallel FIR computation unit 3 computes Yk=F(Zk(1)–Tk)*Xk(1)+F(Zk(2)–Tk)*Xk(2)+ . . . +F(Zk(p) Tk)*Xk(p), thereby obtaining the output digital signal Yk (FIR-LPF interpolation computation).

Figure 2:
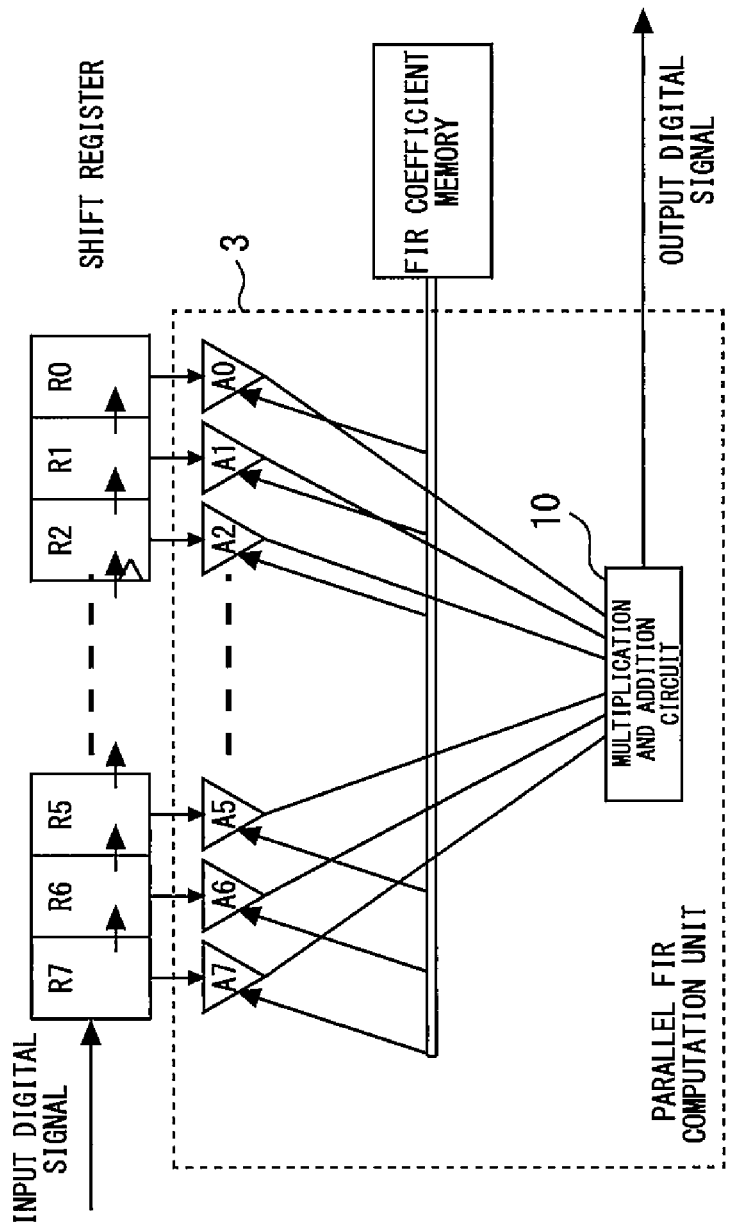
FIG. 2 is a block diagram showing the parallel FIR computation unit according to Embodiment 1 of the present invention.

FIG. 2 is a block diagram showing the parallel FIR computation unit according to Embodiment 1 of the present invention. The FIR computation unit is an 8-Tap parallel FIR computation unit which performs parallel product-sum operation using eight input digital signals to obtain one output digital signal.

Each time the input accumulator 6 accumulates M in synchronization with the processing clock, the input digital signal of one sample is input to one after another of shift registers R0 to R7. When predetermined input digital signals necessary for computation are input to the shift registers R0 to R7, the input digital signals are output from the shift registers R0 to R7 to multipliers A0 to An, the corresponding FIR coefficients are output in parallel from the FIR coefficient memory 9 to multipliers A0 to A7, and multiplication is performed in the multipliers A0 to An. Outputs from the multipliers A0 to A7 are added together in a multiply and accumulation circuit 10, thereby calculating the output digital signal.

Figure 3:
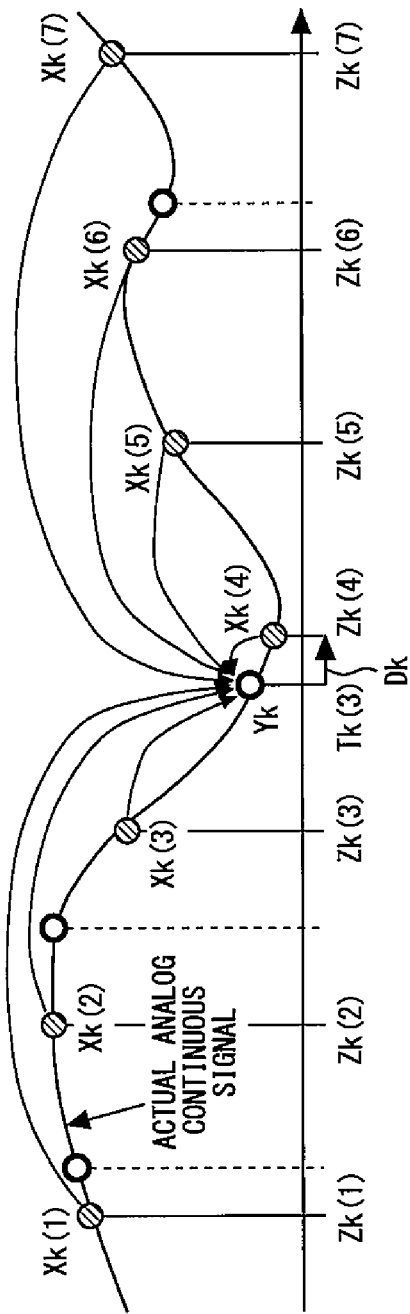
FIG. 3 is a diagram for briefly explaining the principle of FIR-LPF interpolation computation.

FIG. 3 is a diagram for briefly explaining the principle of FIR-LPF interpolation computation. In the figure, hatched circles indicate input digital signals and blank circles indicate output digital signals. The input period M is 4, while the output period N is 5. The output digital signal Yk existing at a position Tk, not existing in the input digital signals, is calculated in an interpolation manner from input digital signals Xk(q) existing near the output digital signal Yk. Since the influence of the near input digital signals Xk(q) is ordinarily reduced as separating from the output digital signal Yk, the FIR coefficients F(Zk(q)–Tk) are used. In the case of an image signal, about thirty input digital signals near the output digital signal Yk (fifteen input digital signals on each side before or after the output digital signal Yk) are used. In the case of audio, a high degree of accuracy is needed and about fifty to one hundred near input digital signals are used. The larger the number of input digital signals used, the higher the accuracy of interpolation computation.

Figure 4:
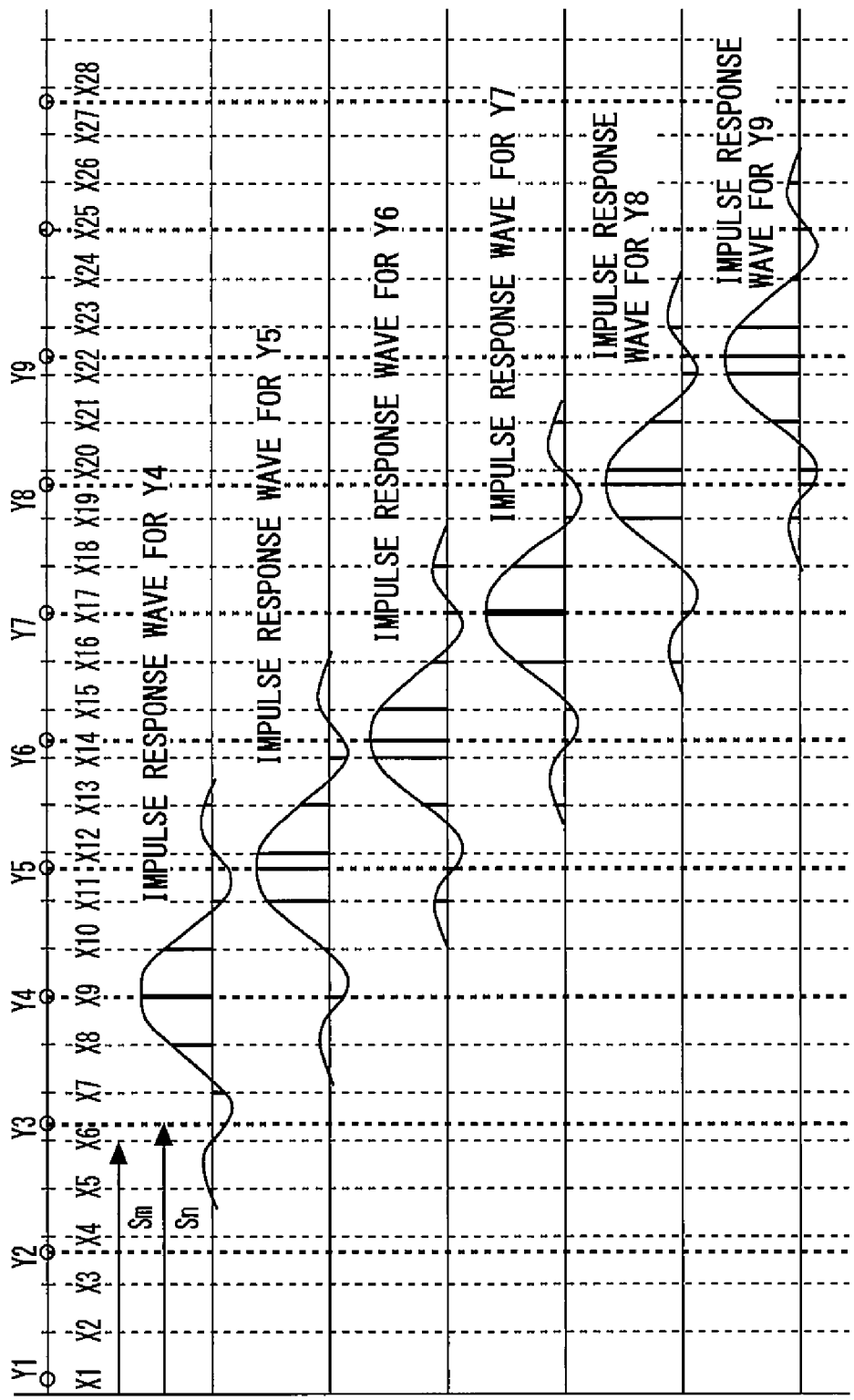
FIG. 4 is a diagram showing the positional relationship between input digital signals and output digital signals.

FIG. 4 is a diagram showing the positional relationship between input digital signals and output digital signals. Each waveform in FIG. 4 represents an impulse response waveform of an FIR filter. A center of each waveform is set at the position Yk of the corresponding output digital signal, and the output digital signal is calculated by FIR-LPF interpolation computation using eight input digital signals. If the eight input digital signals are X0 to X7, and if the amplitudes of the impulse response waveform at the positions of the respective input digital signals are F0 to F7, the output digital signal Y is calculated by Y=ΣXj·Fj (j=0 to 7). When the input/output period ratio is M:N, the input digital signals have recurrence of M number of sorts of positional relationship with the output digital signal. Referring to FIG. 4, since the input/output period ratio M:N is 3:8, three sorts of positional relationship recur.

The FIR filter used is such that the impulse response waveform is symmetric about the position of the impulse input. Such an FIR filter is used for the purpose of eliminating waveform distortions by making a group delay characteristic (variations in delay with respect to frequencies) flat (uniform). If a symmetric impulse response waveform is used, the value of the FIR coefficients at symmetric positions about the center are equal to each other and the number of FIR coefficients can therefore be reduced by half. For example, rearrangements of the same values in the FIR coefficients when the position coordinate difference Dk, in a symmetric positional relationship, is 1 and when the position coordinate difference Dk is (M–1). When the position coordinate difference Dk is 0, the FIR coefficients are self-symmetric.

If Sm and Sn are increased, the numbers of bits, for example, in registers holding Sm and Sn, an adder/subtractor and a magnitude determiner in the position coordinate difference calculation section 5 are increased. To avoid this, an initial value detection and resetting section 11 resets Sm and Sn to the initial values when the difference between Sm and Sn coincides with the initial value. Sm and Sn are also reset to the initial values when a reset signal is externally input.

Table 1 shows changes in accumulated values Sm and Sn in a case where the initial value detection and resetting section 11 is not operated.

TABLE 1

| NUMBER OF CLOCK | M ACCU-MU-LATE | Sm | N ACCU-MU-LATE | Sn | Sn – Sm | Sn – Sm LOW 2 BITS | Modulo (Sn – Sm, M) |
|---|---|---|---|---|---|---|---|
| INITIAL VALUE | | 0 | | 2 | 2 | 10 | 2 |
| 1 | 1 | 3 | 1 | 10 | 7 | 11 | 1 |
| 2 | 1 | 6 | 0 | 10 | 4 | 00 | 1 |
| 3 | 1 | 9 | 0 | 10 | 1 | 01 | 1 |
| 4 | 1 | 12 | 1 | 18 | 6 | 10 | 0 |
| 5 | 1 | 15 | 0 | 18 | 3 | 11 | 0 |
| 6 | 1 | 18 | 1 | 26 | 8 | 00 | 2 |
| 7 | 1 | 21 | 0 | 26 | 5 | 01 | 2 |
| 8 | 1 | 24 | 0 | 26 | 2 | 10 | 2 |
| 9 | 1 | 27 | 1 | 34 | 7 | 11 | 1 |
| 10 | 1 | 30 | 0 | 34 | 4 | 00 | 1 |
| 11 | 1 | 33 | 0 | 34 | 1 | 01 | 1 |
| 12 | 1 | 36 | 1 | 42 | 6 | 10 | 0 |
| 13 | 1 | 39 | 0 | 42 | 3 | 11 | 0 |
| 14 | 1 | 42 | 1 | 50 | 8 | 00 | 2 |
| 15 | 1 | 45 | 0 | 50 | 5 | 01 | 2 |
| 16 | 1 | 48 | 0 | 50 | 2 | 10 | 2 |
| 17 | 1 | 51 | 1 | 58 | 7 | 11 | 1 |
| 18 | 1 | 54 | 0 | 58 | 4 | 00 | 1 |
| 19 | 1 | 57 | 0 | 58 | 1 | 01 | 1 |
| 20 | 1 | 60 | 1 | 66 | 6 | 10 | 0 |
| 21 | 1 | 63 | 0 | 66 | 3 | 11 | 0 |
| 22 | 1 | 66 | 1 | 74 | 8 | 00 | 2 |
| 23 | 1 | 69 | 0 | 74 | 5 | 01 | 2 |
| 24 | 1 | 72 | 0 | 74 | 2 | 10 | 2 |
| 25 | 1 | 75 | 1 | 82 | 7 | 11 | 1 |

The initial values of Sm and Sn are set to values not substantially differing from each other. In this case, the initial values are Sm=0 and Sn=2. Since Sm–Sn≤N and Sn–Sm≤M, the input accumulator 6 accumulates M by the next clock signal and the output accumulator 7 accumulates N. Modulo (Sn–Sm, M) is the remainder (0 to M–1) when Sn–Sm is divided by M.

By the first clock signal, M=3 is accumulated to Sm and N=8 is accumulated to Sn. As a result, Sm=3 and Sn=10. Simultaneously with accumulation of M to Sm, an input digital signal is transfer-shifted. Simultaneously with accumulation of N to Sn, an output digital signal is calculated. With respect to Sn–Sm=7 corresponding to the position coordinate difference Dk at this time, Modulo (Sn–Sm, M) is 1. When M≤$2^B$, Modulo (Sn–Sm, M) is discriminable by referring to less significant B bits of Sn–Sm. Since M<$2^2$ in this case, Modulo (7, 3) can be expressed by two bits and the numeric value expressed by the two less significant bits of Sn−Sm=7 is 3. Accordingly, the set of FIR coefficients when Modulo with respect to the position coordinate difference Dk=Sn−Sm is 1 may be stored at address 3 in the FIR coefficient memory 9. Thus, the value of Sn−Sin can be limited within a narrow numeric value range by modulo computation, and the number of bits expressing the value of M can be associated with the numeric value after modulo computation.

By each of the second and third clock signals, accumulation by M is performed and input digital signals are therefore transfer-shifted. At this time, however, no output digital signal is calculated since accumulation by N is not performed. By each of these clock signals, accumulation by M is necessarily performed since M<N.

When the fourth clock signal is issued, accumulation by N is performed and an output digital signal is therefore calculated. At this time, Modulo (Sn−Sm, M) with respect to Sn−Sm=6 is 0. The numeric value expressed by the two less significant bits of Sn−Sm=6 is 2. Accordingly, the set of FIR coefficients when Modulo with respect to the position coordinate difference Dk=Sn−Sm is 0 may be stored at address 2 in the FIR coefficient memory 9.

By the fifth clock signals, input digital signals are transfer-shifted but no output digital signal is calculated. When the sixth clock signal is issued, an output digital signal is calculated. At this time, Modulo (Sn−Sm, M) with respect to Sn−Sm=8 is 2. The numeric value expressed by the two less significant bits of Sn−Sm=8 is 0. Accordingly, the set of FIR coefficients when Modulo with respect to the position coordinate difference Dk=Sn−Sm is 2 may be stored at address 0 in the FIR coefficient memory 9.

By each of the seventh and eighth clock signals, input digital signals are transfer-shifted but no output digital signal is calculated. When the ninth clock signal is issued, an output digital signal is calculated. At this time, Sn−Sm=7 and the same operation as that when the first clock signal is issued is performed. Subsequently, the above-described operations are repeated.

Sn−Sm indicates the difference between the positions of input and output digital signals. Through settings of Sm and Sn accumulation conditions and initial values, a setting as to by which clock signal an output digital signal is computed and a setting of the position coordinate difference between input and output digital signals can be made. In the above-described example, the position coordinate difference Sn−Sm when the output sample is calculated is 6 to 8. However, if input digital signals are shifted to the extent corresponding to two samples (2×M=6), then Sn−Sm is 0 to 2. This shift can be effected with a circuit configuration. The FIR-LPF coefficient values may alternatively be two-sample-shifted. Alternatively, Sn−Sm itself can be used as an address in the FIR coefficient memory 9 because if the initial values are Sm=3 and Sn=0, Sn−Sm is a value in the range from 0 to 2.

The phenomenon in which the same operations recur periodically according to the values of M and N as described above is utilized by the initial value detection and resetting section 11 for resetting (reinitializing) Sm and Sn to the initial values by possible timing. The hardware scale can thereby be reduced. Table 2 shows changes in accumulated values Sm and Sn when the initial value detection and resetting section 11 is operated.

TABLE 2

| CLOCK | RESET | M ACCU-MULATE | Sm | N ACCU-MULATE | Sn | Sn − Sm | Modulo (Sn − Sm, M) |
|---|---|---|---|---|---|---|---|
| INITIAL VALUE | 1 | | 0 | | 2 | 2 | 2 |
| 1 | 0 | 1 | 3 | 1 | 10 | 7 | 1 |
| 2 | 0 | 1 | 6 | 0 | 10 | 4 | 1 |
| 3 | 0 | 1 | 9 | 0 | 10 | 1 | 1 |
| 4 | 0 | 1 | 12 | 1 | 18 | 6 | 0 |
| 5 | 0 | 1 | 15 | 0 | 18 | 3 | 0 |
| 6 | 0 | 1 | 18 | 1 | 26 | 8 | 2 |
| 7 | 0 | 1 | 21 | 0 | 26 | 5 | 2 |
| 8 | 1 | 1 | 0 | 0 | 2 | 2 | 2 |
| 9 | 0 | 1 | 3 | 1 | 10 | 7 | 1 |
| 10 | 0 | 1 | 6 | 0 | 10 | 4 | 1 |
| 11 | 0 | 1 | 9 | 0 | 10 | 1 | 1 |
| 12 | 0 | 1 | 12 | 1 | 18 | 6 | 0 |
| 13 | 0 | 1 | 15 | 0 | 18 | 3 | 0 |
| 14 | 0 | 1 | 18 | 1 | 26 | 8 | 2 |
| 15 | 0 | 0 | 21 | 0 | 26 | 5 | 2 |
| 16 | 1 | 1 | 0 | 0 | 2 | 2 | 2 |
| 17 | 0 | 1 | 3 | 1 | 10 | 7 | 1 |
| 18 | 0 | 1 | 6 | 0 | 10 | 4 | 1 |
| 19 | 0 | 1 | 9 | 0 | 10 | 1 | 1 |
| 20 | 0 | 1 | 12 | 1 | 18 | 6 | 0 |
| 21 | 0 | 1 | 15 | 0 | 18 | 3 | 0 |
| 22 | 0 | 1 | 18 | 1 | 26 | 8 | 2 |
| 23 | 0 | 1 | 21 | 0 | 26 | 5 | 2 |
| 24 | 1 | 1 | 0 | 0 | 2 | 2 | 2 |
| 25 | 0 | 1 | 3 | 1 | 10 | 7 | 1 |

The operation from initialization to the seventh clock signals is the same as that shown in Table 1. When the eighth clock signal is issued, Sn−Sm coincides with the initial value 2 and the initial value detection and resetting section 11 therefore resets Sm and Sn to the initial values Sm=0 and Sn=2. In the case of a clock synchronization operation system, the operation may be such that Sn−Sm=5 one clock signal before the occurrence of Sn−Sm=2 is detected and synchronization reset (synchronization reinitialization) may be performed when the next clock signal is issued.

The operation from the ninth clock signal to the fifteenth clock signals is the same as the operation from the first clock signal to the seventh clock signal. When the sixteenth clock signal is issued, reset is again performed. The operation from the seventeenth clock signal to the twenty-third clock signals is the same as the operation from the first clock signal to the seventh clock signal. The above-described operations are subsequently repeated.

For example, in a case where an HD image is converted into an SD image, the horizontal period ratio is M:N=3:8 and the ranges of the values of Sm and Sn are about 0 to 1920×3=0 to 720×8=0 to 5760. In this case, therefore, 13-bit registers, adder/subtractor and magnitude determiner for example are required if the above-described reset control is not performed. On the other hand, if the above-described reset control is performed, the maximum value of Sm and Sn is 26 and each of the registers, adder/subtractor and magnitude determiner can be provided in a five-bit configuration.

In the present embodiment, as described above, the position coordinate of an input digital signal close to the position coordinate of an output digital signal is identified. From this position coordinate and the input sampling rate, the position coordinates of a certain number of input digital signals to be used in the FIR-LPF can be determined. The output digital signal can be calculated by reading out FIR coefficients to be applied for the input digital signals from the memory and performing FIR-LPF interpolation computation.

In the present embodiment, because processing such as that described above is performed, the device can operate at an arbitrary clock frequency theoretically irrelevant to the input and output sampling rates. The device is thus capable of operating at arbitrary input and output sampling rates (that is, M and N are arbitrary) and is therefore adaptable to a wide variety of applications. While a sampling rate corresponding to the least common multiple between the input sampling rate and the output sampling rate is conventionally used, use of such a high sampling rate can be avoided in the present embodiment. In order to prevent a delay in operation, however, there is a need to use the higher one of the input and output sampling rates or one clock frequency higher than both of the input and output sampling rates.

Also, while the conventional device operates at three clock frequencies, the device in the present embodiment can operate at one clock frequency. Therefore, the sampling rate conversion device according to the present embodiment can be realized by a low-cost semiconductor technique.

A device incorporating a parallel arrangement of a plurality of FIR computation sections for the purpose of avoiding use of a high sampling rate has been proposed as a conventional art but it has a problem that the circuit scale is considerably increased. In contrast, in the present embodiment, there is no need for such a configuration and the circuit scale can therefore be reduced.

In the present embodiment, the magnitude relationship between Sm and Sn is determined; accumulation of Sm by M and accumulation of Sn by N are performed in such a manner that the state where Sm and Sn do not substantially differ from each other is maintained, thereby calculating the positional relationship between input and output digital signals. In this way, the position coordinate of the input digital signal close to the position coordinate of the output digital signal can easily be identified.

Also, reset control by initial value detection and resetting section 11 enables reducing the number of bits in registers, an adder/subtractor and a magnitude determiner for example.

In end portions of an image, regions not having input digital signals for performing FIR computation exist. In such a case, the image is expanded to external positions (on the right-hand side of the right end, on the left-hand side of the left end, above the upper end and below the lower end) by duplicating pixels in the image end portions and FIR computation is performed. For example, in the case of 8-Tap FIR computation, an image is expanded by duplicating pixels of Tap number/2=4 samples at image end portions. Referring to FIG. 4, therefore, X1 to X4 are actually a duplication of X5. In a case where the parallel FIR computation unit 3 is an A-Tap filter (the sum of A number of items), A number of input digital signals are first transferred to the shift register 2 and calculation of an output digital signal is thereafter started. A half of the A number of input digital signals is a duplication of a sample at the image end portions.

In the present embodiment, the input accumulator 6 accumulates M to Sm when Sm−Sn N, and the output accumulator 7 accumulates N to Sn when Sn−Sm M. In this case, the difference between Sn and Sm is in the range from 0 to N−1. Another accumulation control method may be used in which the input accumulator 6 always accumulates M when M<N and the output accumulator 7 accumulates N to Sn when Sm+N/2≥Sn>Sm−N/2 if N is an even number, or when Sm+(N−1)/2≥Sn>Sm−(N+1)/2 if N is an odd number. In this case, the difference between Sn and Sm is in the range from —N/2 to N/2 or from —(N+1)/2 to (N−1)/2. The absolute value of the difference between the accumulated values Sm and Sn indicating the positions of input and output digital signals can thereby be reduced.

Still another accumulation control method may be used in which the output accumulator 7 always accumulates N when M>N and the input accumulator 6 accumulates M to Sm when Sn+M/2≥Sm>Sn−M/2 if M is an even number, or when Sn+(M−1)/2≥Sm>Sn−(M+1)/2 if M is an odd number. In this case, the difference between Sn and Sm is in the range from −M/2 to M/2 or from −(M+1)/2 to (M−1)/2. The absolute value of the difference between the accumulated values Sm and Sn indicating the positions of input and output digital signals can thereby be reduced.

Also, a simpler accumulation control method may be used in which the input accumulator 6 accumulates M to Sm when Sm≤Sn, and the output accumulator 7 accumulates N to Sn when Sn<Sm. However, only accumulation by M or N is performed, so that the processing time is increased. In Embodiment 3 described below, determination control is performed as a solution to this problem by reading the accumulation of Sm and Sn in advance to reduce the processing time.

In Embodiment 1, horizontal direction sampling rate conversion for an image is assumed. The difference between horizontal direction sampling rate conversion of an image and vertical direction sampling rate conversion of an image will be described. Conversion in the vertical direction is called image number-of-Line conversion. The same configuration of the device is used regardless of whether the direction is horizontal or vertical. However, a Line clock is used for sampling rate conversion. For example, in the case of an HD 60P image, the effective number of pixel Lines is 1080; the ineffective number of Lines is 45; a total of 1125 Lines constitute the image; and the frequency of the Line clock is therefore 67.5 kHz. Line pixel input/output control and FIR coefficient selection are controlled through the Line frequency, and input pixels for a plurality of Lines are taken in a memory and processed. Therefore, when a pan RAMeter, e.g., an FIR coefficient for one pixel is determined, the same pan RAMeter is applied to all the pixels in the same Line. In the case of an HD image, the number of pixels per Line is 1920 pixels and FIR computation is performed in common to all the 1920 pixels. After all, sampling rate conversion computation is performed at the same clock frequency as that for computation in the horizontal direction. While parallel FIR computation for conversion in the horizontal direction is performed by transferring input digital signals to the parallel Read shift registers, calculation of output pixels in the case of conversion in the vertical direction is performed by accessing in parallel a plurality of Lines of predetermined input digital signals and by referring to the input pixels at the same horizontal direction position in each Line.

Embodiment 2

Figure 5:
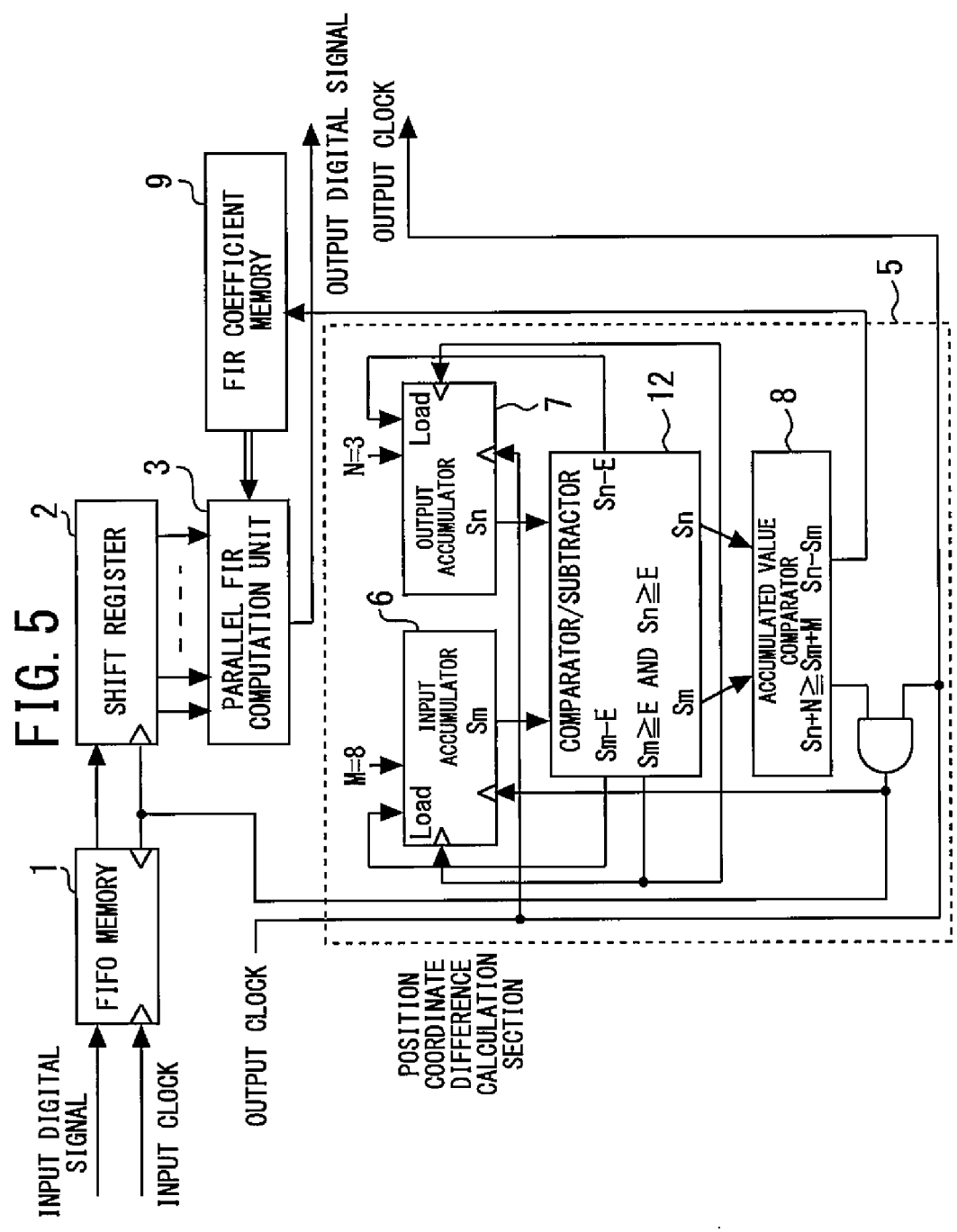
FIG. 5 is a block diagram showing a sampling rate conversion device according to Embodiment 2 of the present invention.

FIG. 5 is a block diagram showing a sampling rate conversion device according to Embodiment 2 of the present invention. The device in the present embodiment can be implemented when the output sampling rate is higher than the input sampling rate, and operates at the output digital signal output sampling rate (output clock). The FIFO memory 1 temporarily stores an input digital signal and thereafter supplies the signal to the shift register 2 in synchronization with the output clock. The parallel FIR computation unit 3 converts the input digital signal supplied from the shift register 2 into an output digital signal and outputs the output digital signal.

The position coordinate difference calculation section 5 further has a comparator/subtractor 12. When Sm≥E and Sn≥E where E is a positive integer equal to or larger than M or equal to or larger than N, the comparator/subtractor 12 simultaneously supplies a Load clock to the input accumulator 6 and the output accumulator 7 and supplies Sm−E and Sn−E to a Load terminal of the input accumulator 6 and a Load terminal of the output accumulator 7, respectively.

The accumulated value comparator 8 makes the input accumulator 6 accumulate M when Sn+N≥Sm+M, and outputs the Sn−Sm at this time as position coordinate difference Dk. Since M>N in this case, the output accumulator 7 always accumulates N.

Table 3 shows changes in accumulated values Sm and Sn in a case where M=8, N=3, the initial value of Sm is 4, the initial value of Sn is 1.5 and E=16 (the fourth power of 2).

TABLE 3

| CLOCK | RE-SET | M ACCU-MU-LATE | Sm | N ACCU-MU-LATE | Sn | Sn − Sm | LOW 4 BITS | Modulo (Sn − Sm, M) |
|---|---|---|---|---|---|---|---|---|
| INITIAL VALUE | 1 | | 4 | | 1.5 | −2.5 | 1011 | 5.5 |
| 1 | 0 | 1 | 12 | 1 | 4.5 | −7.5 | 0001 | 0.5 |
| 2 | 0 | 0 | 12 | 1 | 7.5 | −4.5 | 0111 | 3.5 |
| 3 | 0 | 0 | 12 | 1 | 10.5 | −1.5 | 1101 | 6.5 |
| 4 | 0 | 1 | 20 | 1 | 13.5 | −6.5 | 0011 | 1.5 |
| 5 | 0 | 0 | 20 | 1 | 16.5 | −3.5 | 1001 | 4.5 |
| 6 | 1 | 0 | 4 | 1 | 3.5 | −0.5 | 1111 | 7.5 |
| 7 | 0 | 1 | 12 | 1 | 6.5 | −5.5 | 0101 | 2.5 |
| 8 | 0 | 0 | 12 | 1 | 9.5 | −2.5 | 1011 | 5.5 |
| 9 | 0 | 1 | 20 | 1 | 12.5 | −7.5 | 0001 | 0.5 |
| 10 | 0 | 0 | 20 | 1 | 15.5 | −4.5 | 0111 | 3.5 |
| 11 | 0 | 0 | 20 | 1 | 18.5 | −1.5 | 1101 | 6.5 |
| 12 | 1 | 1 | 12 | 1 | 5.5 | −6.5 | 0011 | 1.5 |
| 13 | 0 | 0 | 12 | 1 | 8.5 | −3.5 | 1001 | 4.5 |
| 14 | 0 | 0 | 12 | 1 | 11.5 | −0.5 | 1111 | 7.5 |
| 15 | 0 | 1 | 20 | 1 | 14.5 | −5.5 | 0101 | 2.5 |
| 16 | 0 | 0 | 20 | 1 | 17.5 | −2.5 | 1011 | 5.5 |
| 17 | 1 | 1 | 12 | 1 | 4.5 | −7.5 | 0001 | 0.5 |
| 18 | 0 | 0 | 12 | 1 | 7.5 | −4.5 | 0111 | 3.5 |
| 19 | 0 | 0 | 12 | 1 | 10.5 | −1.5 | 1101 | 6.5 |
| 20 | 0 | 1 | 20 | 1 | 13.5 | −6.5 | 0011 | 1.5 |
| 21 | 0 | 0 | 20 | 1 | 16.5 | −3.5 | 1001 | 4.5 |
| 22 | 1 | 0 | 4 | 1 | 3.5 | −0.5 | 1111 | 7.5 |
| 23 | 0 | 1 | 12 | 1 | 6.5 | −5.5 | 0101 | 2.5 |
| 24 | 0 | 0 | 12 | 1 | 9.5 | −2.5 | 1011 | 5.5 |
| 25 | 0 | 1 | 20 | 1 | 12.5 | −7.5 | 0001 | 0.5 |

The operation from initialization to the fourth clock signal is the same as that in Embodiment 1. By the fifth clock signal, Sm≥E and Sn≥E are satisfied. By the sixth clock signal, E (=16) is subtracted from Sm and Sn. The decimal parts of Sm and Sn set as initial values are not changed at this time. A condition for subtraction of E is satisfied by each of the eleventh, sixteenth and twenty-first clock signals, and E (=16) is subtracted from Sm and Sn by the twelfth, seventeenth and twenty-second clock signals.

In Embodiment 1, reset is performed in cycles of the least common multiple between the input and output periods M and N. In the present embodiment, setting E equal to or larger than M or equal to or larger than N suffices, so that the number of bits in, for example, registers, an adder/subtractor and magnitude determiner can be further reduced from that in Embodiment 1. If E is smaller than M or N, Sm and Sn are not sufficiently reduced by subtracting E from Sm and Sn; Sm and Sn continue increasing; and the number of bits cannot be sufficiently reduced.

Preferably, E is some power of 2 equal to or larger than M or equal to or larger than N. In this case, determination as to whether Sm≥E and Sn≥E can easily be made by detecting change of a bit indicating the value of E from 0 to 1.

If E is, for example, 5 in the case where M=8 and N=3, two units of comparator/subtractor 12 are required. On the other hand, if E=16 for example is selected, determination as to whether the fifth bits of Sm and Sn are simultaneously 1 may be made and both the bits may be changed from 1 to 0 if the determination result is true. In this case, therefore, there is no need for subtractors for calculating Sm−E and Sn−E and a circuit for determination as to whether Sm≥E and Sn≥E, and the comparator/subtractor 12 can be constituted by a simple gate logic circuit which determines whether the fifth bits of Sm and Sn are 0 or 1.

While in Embodiment 1 the position coordinate difference between input and output digital signals is an integer, there is a possibility of the position coordinate difference being smaller than 1 in actual use. In the present embodiment, the accuracy of the input accumulator 6 and the output accumulator 7 is set to 0.5, not 1, by considering a situation where the position of an output digital signal is 0.5 shifted from the position of an input digital signal. More specifically, although the accumulation of M and N is the same as that in Embodiment 1, the initial values of Sm and Sn are values in units of 0.5. That is, the accuracy of the input accumulator 6 and the output accumulator 7 is extended into the decimal part, thereby enabling the output digital signal position to be arbitrarily shifted.

Such an extension into the decimal part is needed, for example, when center points of input and output images are set to a center point of a frame. The sort of position coordinate difference Dk used at the time of selection of FIR coefficients is not influenced by fractions (decimal parts) of the initial values smaller than 1. Therefore, the number of sets of FIR coefficients is the same as that in Embodiment 1. While the four less significant bits in Table 3 are shown as a portion including one bit for the decimal part, the least significant bit (LSB) is always "1". Therefore, the three bit except the LSB are substantially significant data to be referred to for selection from the sets of FIR coefficients.

Embodiment 3

Figure 6:
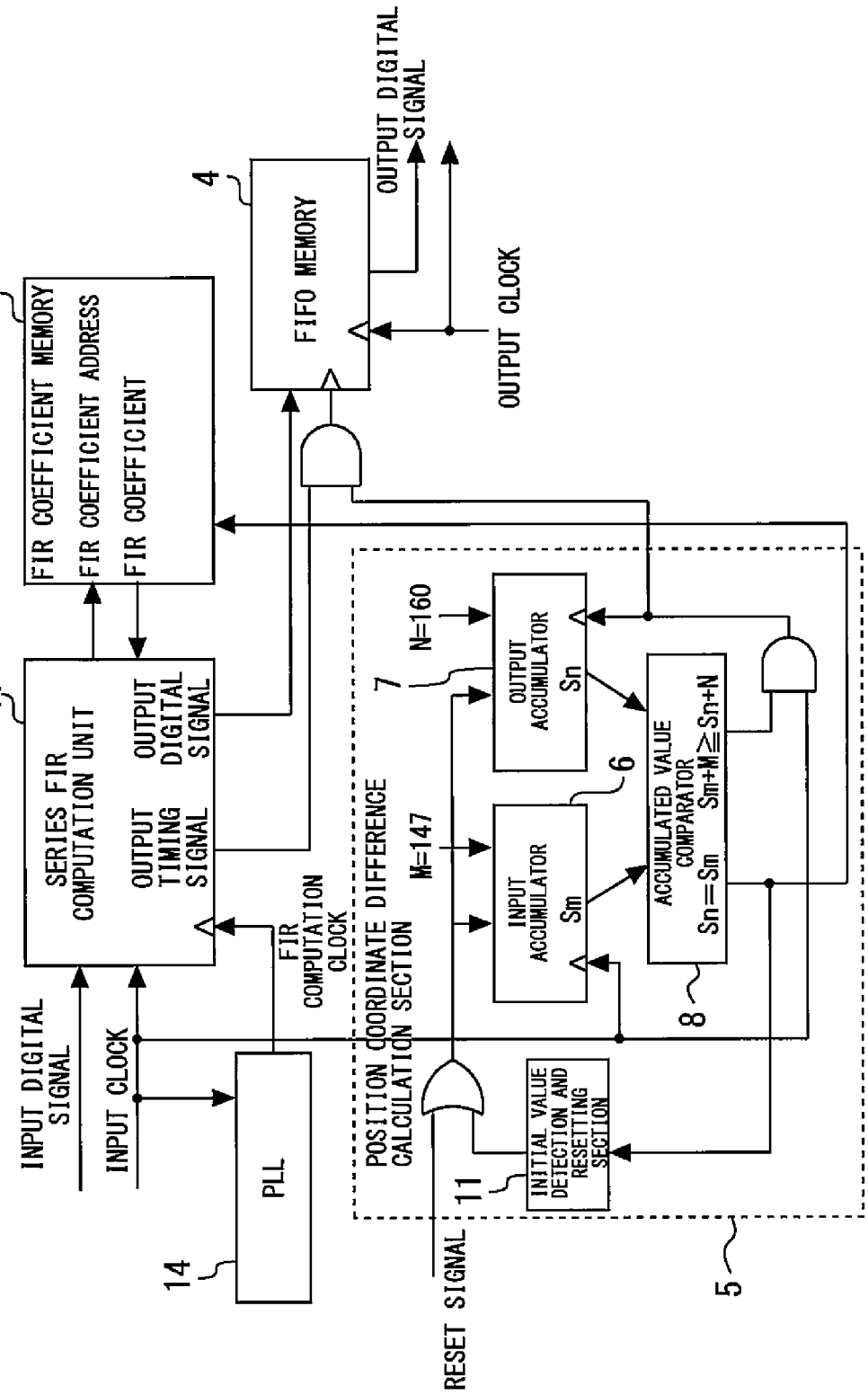
FIG. 6 is a block diagram showing a sampling rate conversion device according to Embodiment 3 of the present invention.

FIG. 6 is a block diagram showing a sampling rate conversion device according to Embodiment 3 of the present invention. The device in the present embodiment is a sampling rate conversion device mainly for digital audio use, which converts an input digital signal sampled at an input sampling rate of 48 kHz (an ordinary frequency in the field of professional digital audio) into an output digital signal sampled at an output sampling rate of 44.1 kHz (audio CD). The sampling rate conversion in this case is time-based one-dimensional sampling rate conversion.

The devices in Embodiments 1 and 2 are intended mainly for image processing, have an image sampling rate (the frequency of a sequence of pixel samples) is about several MHz to 150 MHz, and therefore use the parallel FIR computation unit 3 for performing product-sum operation by referring to several ten samples with respect to each pixel. In contrast, an audio sampling rate is as low as several ten kHz, and even a frequency several 100 times higher than this is about several 10 MHz. In the present embodiment, therefore, a series FIR computation unit 13 is used, thereby reducing the scale of the circuit configuration including a multiplier.

The device in the present embodiment operates at an input sampling rate (input clock 48 kHz) at which an input digital signal is sampled. However, the FIR order (the number of input digital signals to be referred to) in audio is high while the sampling rate is low. Therefore, an FIR computation clock of 12.288 MHz 256 times higher than the input clock is generated by a PLL 14. The series FIR computation unit 13 operates by this FIR computation clock to convert an input digital signal into an output digital signal. In the case of this 256× clock, the order of FIR (the number of samples of an input digital signal to be referred to in FIR computation) is 255 at the maximum. The FIFO memory 4 stores the output digital signal, delays the signal by a suitable time interval (for example, corresponding to passage of about 100 samples of the input digital signal after initialization) and thereafter outputs the output digital signal in synchronization with the 44.1 kHz output clock.

The position coordinate difference calculation section 5 operates on the input clock. In the case where the input clock is 48 kHz and the output clock is 44.1 kHz, the period ratio M:N=147:160. The accumulated value comparator 8 makes the output accumulator 7 accumulate N when $Sm+M \geq Sn+N$, and outputs the Sn−Sm at this time as position coordinate difference Dk. Since N>M in this case, the input accumulator 6 always accumulates M. When the difference between Sm and Sn coincides with the initial value, the initial value detection and resetting section 11 resets Sm and Sn to the initial values, as in Embodiment 1.

In the case where M=147 and N=160, the number of sorts of position coordinate difference Dk is 147 (0 to 146). With respect to each of the 147 sorts of position coordinate difference Dk, fifty FIR coefficients are required in the case of fiftieth-order FIR. While an image signal ordinarily has 8 to 10 bits/sample, an audio signal has 12 to 24 bits/sample and sample value calculation of high quality is required for the audio signal. Therefore, the FIR order in this case is at least several times higher than that in the case of processing an image. In this embodiment, the FIR order is assumed to be the fiftieth for ease of description.

Figure 7:
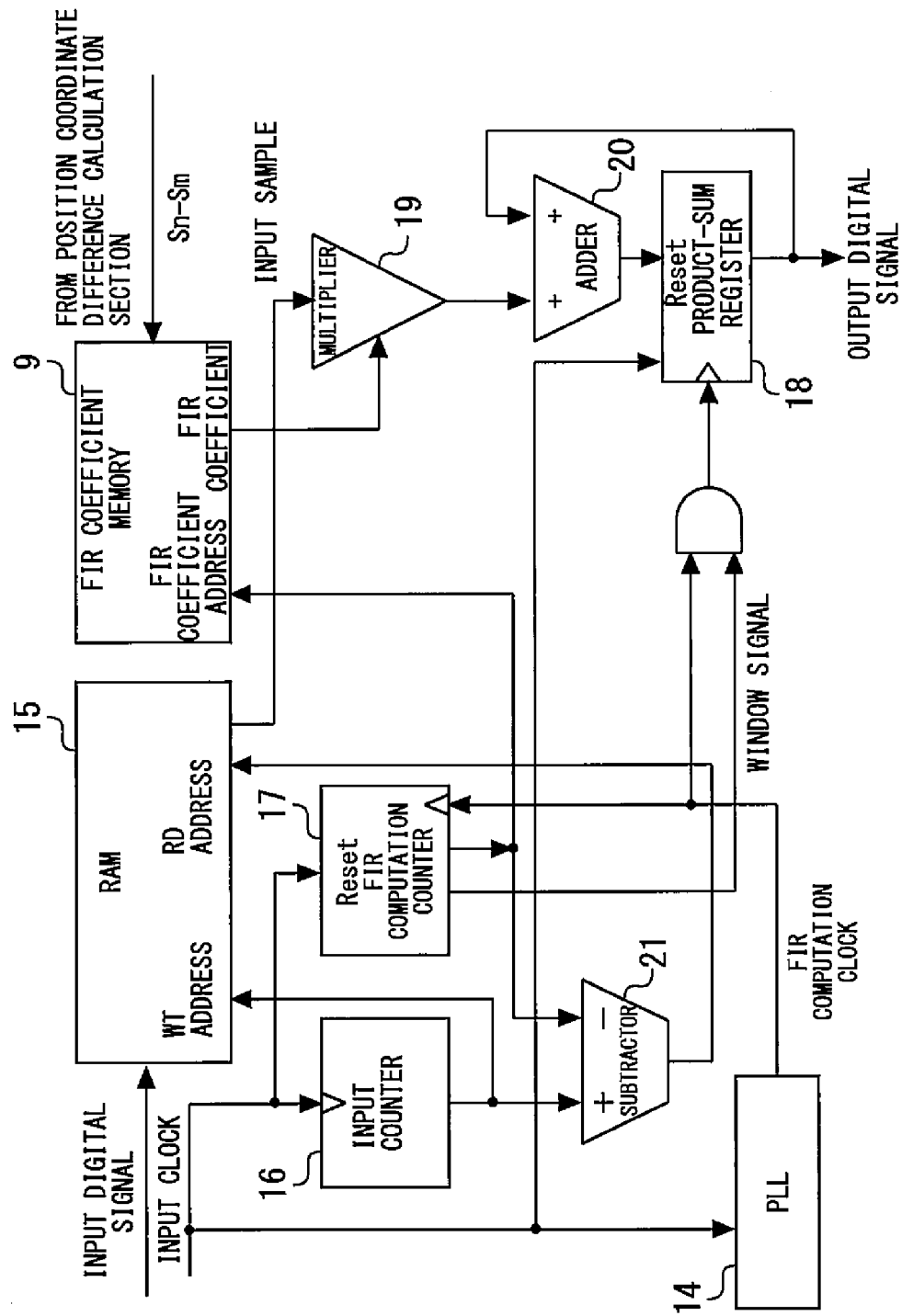
FIG. 7 is a block diagram showing the series FIR computation unit according to Embodiment 3 of the present invention.
Figure 8:
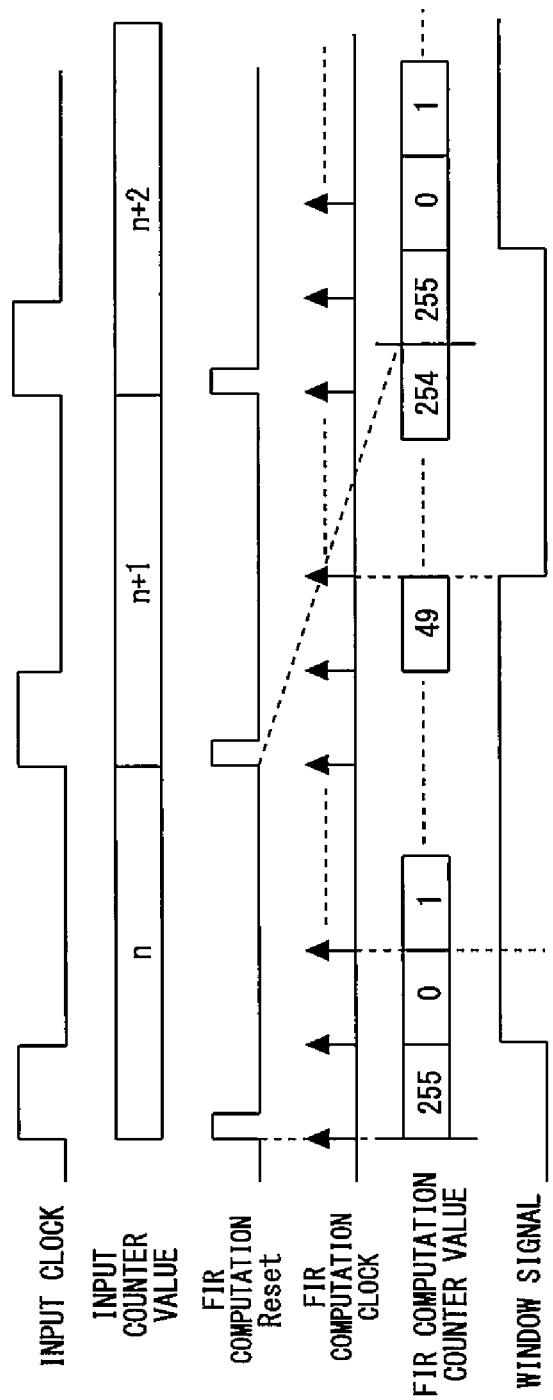
FIG. 8 is a timing chart showing the operation of the series FIR computation unit.
Figure 9:
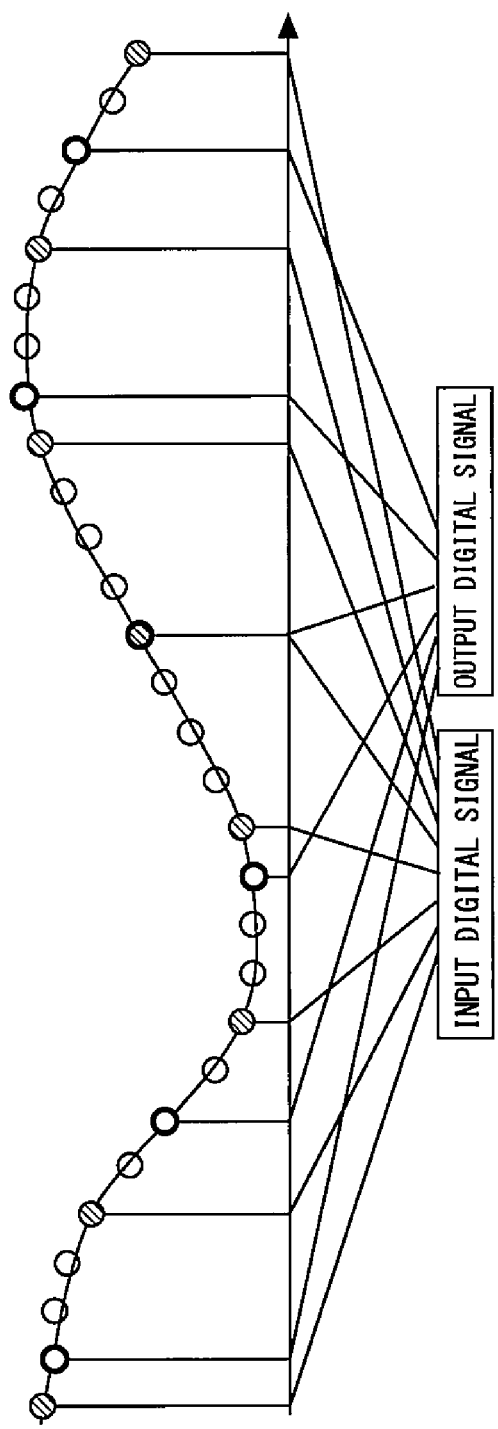
FIG. 9 is a diagram for explaining a conventional sampling rate conversion method.
Figure 10:
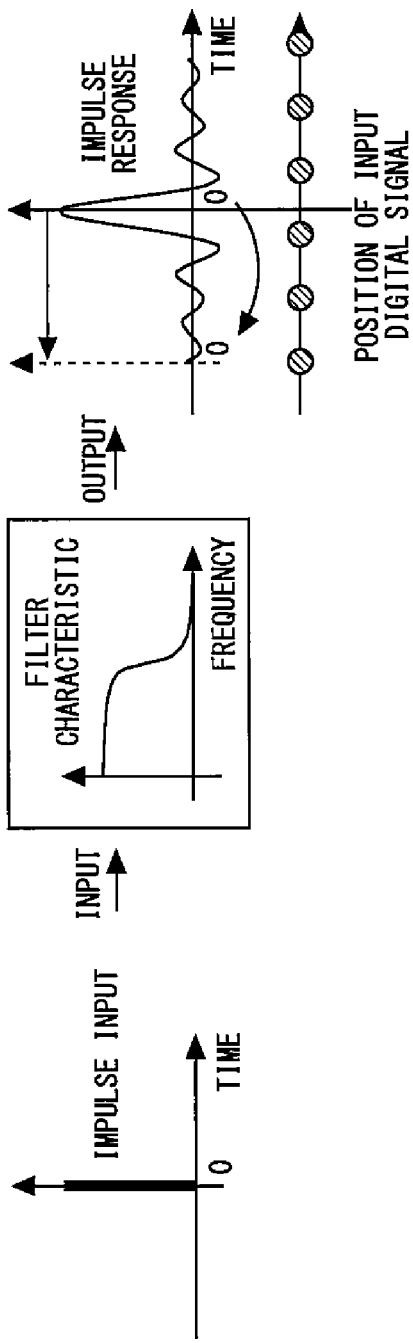
FIG. 10 is a diagram showing impulse response of an FIR-LPF.

FIG. 7 is a block diagram showing the series FIR computation unit according to Embodiment 3 of the present invention. FIG. 8 is a timing chart showing the operation of the series FIR computation unit. This Series FIR computation unit is a 50-Tap series FIR computation unit which performs series product-sum operation using fifty input digital signals to obtain one output digital signal.

In the case of series FIR computation, an input digital signal is stored not in shift registers but in a random access memory (RAM) 15 on a sample-by-sample basis. The input digital signal is stored in the RAM 15 by generating addresses with an input counter 16. For ease of description, the RAM 15 is assumed to be a 2-Port RAM capable of simultaneously performing Write and Read. If the RAM 15 stores, for example, 256 samples with 8-bit addresses, the address in the RAM 15 is set to 0, 1, ... , 255 and thereafter returned to 0.

Sn−Sm is supplied from the position coordinate difference calculation section 5 to the FIR coefficient memory 9 and the set of FIR coefficients corresponding to Sn−Sm is selected. AN FIR computation counter 17 is reset to 155 in synchronization with the input clock. Simultaneously, a product-sum register 18 is also reset to 0. Thereafter, fifty input digital signals Xj (j=0 to 49) for calculating one output digital signal are determined, and the product of the input digital signals and the FIR coefficients Fj (j=0 to 49) corresponding to the input digital signals is multiplied by a multiplier 19. The product-sum of the product Xj−Fj is obtained by an adder 20 with respect to FIR computation clock signals and is stored by the product-sum register 18. After the entire product-sum is completed, an output digital signal $Y=X0 \cdot F0+X1 \cdot F1+ \ldots +X49 \cdot F49$ is calculated.

The RAM 15 holds the 256 samples even when the FIR computation counter value is smaller than 49 and is configured in ring form. Therefore, the sample immediately before the position corresponding to n=0 is held by the address 255. Accordingly, an output 0−1=−1 from a subtractor 21 is 255 and the proper input digital signals are successively referred to.

The series FIR computation ends within the period of one input digital signal, and the data in the RAM 15 is not changed during the period. In the case where FIR computation is of the fiftieth order (FIR computation performed by referring to fifty input digital signals), FIR computation is performed while the FIR computation counter value is in the range from 0 to 49. During the computation, the FIR computation counter 17 supplies a reference input sample window signal to the product-sum register 18. When the FIR computation counter value becomes 50, the result of FIR computation at that time is output. During the time period which the counter has other counter values 51 to 254, no operation is performed and the counter is reset when the counter value 255 is reached.

When the FIR computation counter 17 starts operating, the subtractor 21 subtracts the value of the FIR computation counter from the value of the input counter 16 used for Write addresses in the RAM 15. The input digital signal at the Read address corresponding to the subtraction value is successively referred to. That is, the input digital signal one-sample-past relative to the latest input digital signal is referred to. For example, when the input counter value is n at the start of the computation, the FIR computation counter values 0 to 49 are successively subtracted from n. Accordingly, outputs from the subtractor 21 are n, n−1, ... , n−49. The input digital signals at the Read addresses n to n−49 are thereby successively referred to. Simultaneously, the FIR coefficient memory 9 is accessed at addresses of the FIR computation counter values 0 to 49. Therefore, the FIR coefficients corresponding to the input digital signal Xn is F(0), F(1) with respect to Xn−1, F(2) with respect to Xn−2, ... , and F(49) with respect to Xn−49. The FIR computation counter value for the sample at the center position in the sequence of input digital signals referred is 24 or 25. Therefore, the input digital signal close to the output digital signal is X24 or X25.

Table 4 shows changes in accumulated values Sm and Sn in the present embodiment.

TABLE 4

| RESET | 0 | 0 | 0 | | 0 | 0 | 1 | 0 | 0 | 0 | 0 | 0 | 0 | 0 |
|---|---|---|---|---|---|---|---|---|---|---|---|---|---|---|
| INITIALIZE CLOCK | 1 | 1 | 1 | ... | 1 | 1 | 0 | 0 | 0 | 0 | 0 | 0 | 0 | 0 |
| CLOCK CUMULATIVE NUMBER | 0 | 0 | 0 | ... | 0 | 0 | 0 | 1 | 2 | 3 | 4 | 5 | 6 | 7 |
| TIME | | | | | | | T0 | T1 | T2 | T3 | T4 | T5 | T6 | T7 |
| Sm ACCUMULATE | 0 | 0 | 0 | | 0 | 0 | 0 | 1 | 1 | 1 | 1 | 1 | 1 | 1 |
| Sm | | | | | | | 0 | 147 | 294 | 441 | 588 | 735 | 882 | 1029 |
| Sn ACCUMULATE | | | | | | | 0 | 0 | 1 | 1 | 1 | 1 | 1 | 1 |
| Sn | | | | | | | 0 | 0 | 160 | 320 | 480 | 640 | 800 | 960 |

TABLE 4-continued

| | | | | | | | | | | | | | | |
|---|---|---|---|---|---|---|---|---|---|---|---|---|---|---|
| Sm − Sn | | | | | | | 0 | 147 | 134 | 121 | 108 | 95 | 82 | 69 |
| INPUT | X0 | X1 | X2 | ... | X46 | X47 | X48 | X49 | X50 | X51 | X52 | X53 | X54 | X55 |
| OUTPUT | | | | | | | | | Y0 | Y1 | Y2 | Y3 | Y4 | Y5 |
| RESET | 1 | 0 | 0 | 0 | 0 | 0 | 0 | 0 | 1 | 0 | 0 | 0 | 0 | 0 |
| INITIALIZE CLOCK | 0 | 0 | 0 | 0 | 0 | 0 | 0 | 0 | 0 | 0 | 0 | 0 | 0 | 0 |
| CLOCK CUMULATIVE NUMBER | 8 | 9 | 10 | 11 | 12 | 13 | 14 | 15 | 16 | 17 | 18 | 19 | 20 | 21 |
| TIME | T8 | T9 | T10 | T11 | T12 | T13 | T14 | T15 | T16 | T17 | T18 | T19 | T20 | T21 |
| Sm ACCUMULATE | 1 | 1 | 1 | 1 | 1 | 1 | 1 | 1 | 1 | 1 | 1 | 1 | 1 | 1 |
| Sm | 1176 | 1323 | 1470 | 1617 | 1754 | 1911 | 2058 | 2205 | 2352 | 2499 | 2646 | 2793 | 2940 | 3087 |
| Sn ACCUMULATE | 1 | 1 | 1 | 1 | 1 | 0 | 1 | 1 | 1 | 1 | 1 | 1 | 1 | 1 |
| Sn | 1120 | 1280 | 1440 | 1600 | 1760 | 1780 | 1920 | 2080 | 2240 | 2400 | 2560 | 2720 | 2880 | 3040 |
| Sm − Sn | 56 | 43 | 30 | 17 | 4 | 151 | 136 | 125 | 112 | 99 | 86 | 73 | 60 | 47 |
| INPUT | X56 | X57 | X58 | X59 | X60 | X61 | X62 | X63 | X64 | X65 | X66 | X67 | X68 | X69 |
| OUTPUT | Y6 | Y7 | Y8 | Y9 | Y10 | ... ... | Y11 | Y12 | Y13 | Y14 | Y15 | Y16 | Y17 | Y18 |
| RESET | 1 | 0 | 0 | 1 | 0 | 0 | 0 | 0 | 1 | 0 | 0 | 0 | 0 | |
| INITIALIZE CLOCK | 0 | 0 | 0 | 0 | 0 | 0 | 0 | 0 | 0 | 0 | 0 | 0 | 0 | |
| CLOCK CUMULATIVE NUMBER | 157 | 158 | 159 | 160 | 161 | 162 | 163 | 164 | 165 | 166 | 167 | 168 | 169 | |
| TIME | T157 | T158 | T159 | T160 | T161 | T162 | T163 | T164 | T165 | T166 | T167 | T168 | T169 | |
| Sm ACCUMULATE | 1 | 1 | 1 | 1 | 1 | 1 | 1 | 1 | 1 | 1 | 1 | 1 | 1 | |
| Sm | 23079 | 23226 | 23373 | 23520→0 | 147 | 294 | 441 | 588 | 735 | 882 | 1029 | 23226 | 23373 | |
| Sn ACCUMULATE | 1 | 1 | 1 | 1 | 0 | 1 | 1 | 1 | 1 | 1 | 1 | 1 | 1 | |
| Sn | 23040 | 23200 | 23360 | 23520→0 | 0 | 160 | 320 | 480 | 640 | 800 | 960 | 800 | 960 | |
| Sm − Sn | 39 | 26 | 13 | 0 | 147 | 134 | 121 | 108 | 95 | 82 | 69 | 82 | 69 | |
| INPUT | X205 | X206 | X207 | X208 | X209 | X210 | X211 | X212 | X213 | X214 | X215 | X216 | X217 | |
| OUTPUT | Y143 | Y144 | Y145 | Y146 | ... | Y147 | Y148 | Y149 | Y150 | Y151 | Y152 | Y153 | Y154 | |

X0 to X48 (49 samples) in the reference input digital signals X0 to X49 in fifties-order FIR computation are first written to the RAM 15. Initialization reset is performed at time T0 to reset the input/output accumulated values Sm and Sn to 0. Also during the reset period, the input digital signal is written. After the reset, the RAM 15 has a total of fifty input digital signals X0 to X49 written thereto.

After initialization, the sampling rate conversion operation is started. By the first clock signal after initialization (time T1), M is accumulated to Sm but N is not accumulated to Sn since Sm+M<Sn+N. Therefore, no output digital signal is computed. At this time, Sm=147, Sn=0.

At time T2, Sm+M≥Sn+N is satisfied, and M and N are therefore accumulated to Sm and Sn, respectively, and an output digital signal is calculated. At this time, Sm=294 and Sn=160. Y0=X0·F0+X1·F1+ . . . +X49·F49 is calculated by referring to the input digital signals X0 to X49, thereby obtaining the output digital signal Y0. F0 to F49 are the FIR coefficients for X0 to X49. This set of FIR coefficients is selected from the FIR coefficient memory 9 at addresses corresponding to Sn−Sm=160−294=−134 and Modulo (−134, 147)=13.

Since the FIR coefficient memory 9 needs 6 bits for selection of fifty FIR coefficients for fiftieth-order FIR and 8 bits for selection of position coordinate differences Dk 0 to 146 and is therefore constituted by an RAM having a total of 14 bits. The memory operates at 12.288 MHz for selection of fifty FIR coefficients and operates at 48 kHz for selection of position coordinate differences Dk.

The same operation is performed after time T3. From time T3 to T12, the condition Sm+M≥Sn+N is satisfied and output digital signals Y1 to Y10 are therefore calculated successively. At time T13, Sm+M=1911<Sn+N=1920. At this time, therefore, no output digital signal is calculated. At time T14, Sm+M≥Sn+N and an output digital signal Y11 is calculated.

After the same operation is continued for a while, the difference between Sm and Sn coincides with the initial value at time T160 and Sm and Sn are therefore reset to initial value 0. The operation after the reset is the same as the operation after initialization.

In the present embodiment, the same advantages as those of Embodiment 1 can also be obtained by the above-described configuration and operation. Reset control is also performed in the present embodiment in the same way as in Embodiment 1. Reset is necessarily performed at image end portions in image sampling rate conversion. In the case of audio, however, sampling is continued at a constant rate on the time base so that the sum value is infinitely increased since there is no spatial division or limit such as that of an image. In the sampling rate conversion device for audio use, therefore, reset control is particularly important.

For example, if no reset control is performed in a case where M=147, N=160 and audio sampling is continued for 24 hours, Sm and Sn become 147×48000×3600×24=160×44100×3600×24≈6.1×10$^{11}$≈2$^{39.2}$ and expressed by 40 bits. In the present embodiment, reset is performed when both Sm and Sn become 23360, and the maximum values of Sm and Sn are 23360 and can be expressed by 15 bits. Therefore, the accuracy of the adder/subtractor for example, for which 40 bits are required with respect to 24-hour continuous operation, can be reduced to 15 bits by reset control.

In the present embodiment, an arrangement for concurrently subtracting E from Sm and Sn when Sm≥E and Sn≥E, such as that in Embodiment 2, may also be adopted. The number of bits in the registers, adder/subtractor and magnitude determiner for example can be further reduced thereby. For example, when M=147, and N=160, it is preferable to set E to some power of 2, e.g., 256, equal to or larger than 147 to enable the device to be easily formed by a binary hardware configuration. In this case, determination as to whether or not Sm and Sn is equal to or larger than 256 can be made by determining whether or not each of the ninth bits of Sm and Sn is 1. When each of the ninth bits of Sm and Sn is 1, therefore, the ninth bits of Sm and Sn may be simultaneously set to 0. The number of bits in the registers, adder/subtractor and magnitude determiner for example can thereby be set to nine bits.

DESCRIPTION OF SYMBOLS

3 parallel FIR computation unit (FIR computation unit), 5 position coordinate difference calculation section, 6 input accumulator, 7 output accumulator, 8 accumulated value comparator, 9 FIR coefficient memory, 11 initial value detection and resetting section, 12 comparator/subtractor, 13 series FIR computation unit (FIR computation unit)

The invention claimed is:

1. A sampling rate conversion device which converts an input digital signal sampled at an input sampling rate into an output digital signal sampled at an output sampling rate, comprising:
   a position coordinate difference calculation section calculating a position coordinate difference $D_k$ between a position coordinate of the input digital signal close to a position coordinate $T_k$ of the output digital signal $Y_k$ and the position coordinate $T_k$;
   an FIR coefficient memory storing, with respect to a finite impulse response-low pass filter (FIR-LPF) having such a characteristic as to cut off frequency components equal to or higher than ½ of the output sampling rate, an FIR coefficient $F(z)$ of the FIR-LPF when a position coordinate of an impulse input to the FIR-LPF is $z=0$, wherein when the position coordinate difference $D_k$ is input, the FIR coefficient memory outputs FIR coefficients $F(Z_k(q)-T_k)$ corresponding to a position coordinate differences $(Z_k(q)-T_k)$ with respect to $Z_k(q)$ ($q=1, 2, \ldots, p$) representing position coordinates of a certain number (p) of input digital signals $X_k(q)$ existing in the vicinity of the position coordinate $T_k$ of the output digital signal $Y_k$; and
   an FIR computation unit computing $Y_k=F(Z_k(1)-T_k)*X_k(1)+F(Z_k(2)-T_k)*X_k(2)+\ldots+F(Z_k(p)-T_k)*X_k(p)$ and obtaining the output digital signal $Y_k$, wherein C is a constant, M and N are positive integers prime to each other, a sampling period of the input digital signal is C·M, a sampling period of the output digital signal is C·N, and
   the position coordinate difference calculation section includes:
   an input accumulator accumulating M and outputting an accumulated value Sm;
   an output accumulator accumulating N and outputting an accumulated value Sn;
   an accumulated value comparator making the input accumulator accumulate M when Sm−Sn is equal to or less than a predetermined value, making the output accumulator accumulate N when Sn−Sm is equal to or less than a predetermined value, and outputting, as the position coordinate difference $D_k$, Sn−Sm obtained when the output accumulator is made to accumulate N.

2. The sampling rate conversion device according to claim 1, further comprising an initial value detection and resetting section resetting Sm and Sn to initial values when a difference between Sm and Sn coincides with an initial value.

3. The sampling rate conversion device according to claim 1, wherein the position coordinate difference calculation section further includes a comparator/subtractor concurrently subtracting E from Sm and Sn when Sm≥E and Sn≥E where E is a positive integer equal to or larger than M or equal to or larger than N.

4. The sampling rate conversion device according to claim 1, wherein accuracy of the input accumulator and the output accumulator is improved into fraction part.

* * * * *